United States Patent
Ma et al.

[11] Patent Number: 5,960,302
[45] Date of Patent: *Sep. 28, 1999

[54] METHOD OF MAKING A DIELECTRIC FOR AN INTEGRATED CIRCUIT

[75] Inventors: Yi Ma; Pradip Kumar Roy, both of Orlando, Fla.; Kevin Yun-Kang Wu, Austin, Tex.

[73] Assignee: Lucent Technologies, Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/775,790

[22] Filed: Dec. 31, 1996

[51] Int. Cl.$^6$ .................................................. H01L 21/3205
[52] U.S. Cl. .................. 438/585; 438/591; 438/301; 438/299
[58] Field of Search ................ 437/195, 43, 42; 438/585, 591, 301, 299

[56] References Cited

U.S. PATENT DOCUMENTS

| | | | |
|---|---|---|---|
| 3,793,090 | 2/1974 | Barile et al. | 438/591 |
| 3,878,549 | 4/1975 | Yamazaki et al. | 438/591 |
| 4,217,601 | 8/1980 | DeKeersmaecker et al. | 438/591 |
| 4,305,086 | 12/1981 | Khajezadeh | 438/591 |
| 4,980,307 | 12/1990 | Ito et al. | 438/591 |
| 5,304,829 | 4/1994 | Mori et al. | 437/43 |
| 5,407,870 | 4/1995 | Okada et al. | 438/591 |
| 5,464,783 | 11/1995 | Kim et al. | 438/591 |
| 5,541,129 | 7/1996 | Tsunoda | 437/43 |
| 5,571,734 | 11/1996 | Tseng et al. | 438/591 |
| 5,688,724 | 11/1997 | Yoon et al. | 438/591 |

OTHER PUBLICATIONS

H. R. Soleimani et al., "Formation of Ultrathin Nitrided SiO$_2$ Oxides by Direct Nitrogen Implantation into Silicon," J. Electrochem Soc., vol. 142, No. 8, Aug. 1995, pp. 132–134.

T. Kuroi et al., "The Effects of Nitrogen Implantation Into P$^+$ Poly–silicon Gate on Gate Oxide Properties," 1994 Symposium on VLSI Technology Digest of Technical Papers, pp. 107–108.

K. S. Krisch et al, "Impact of Boron Diffusion Through O$_2$ and N$_2$O Gate Dielectrics on the Process Margin of Dual–Poly Low Power CMOS," 1994 IEEE, pp. 325–328.

G. Q. Lo et al, "P–Channel MOSFET's with Ultrathin N$_2$O Gate Oxides," IEEE Electron Device Letters, vol. 12, No. 2, Feb. 1992, pp. 111–113.

*Primary Examiner*—John F. Niebling
*Assistant Examiner*—Lynne A. Gurley

[57] ABSTRACT

A composite 3-layer gate dielectric is disclosed. The upper and lower layers have a concentration of nitrogen atoms, while the middle layer has very few nitrogen atoms. The presence of the nitrogen atoms in the top sublayers provides resistance to boron diffusion from the top conductive layer and plasma damage during polysilicon gate stack formation and the presence of nitrogen in the bottom sublayer near the silicon-dielectric interface improves wearout, endurance, resistance to current stress and electron traps.

12 Claims, 2 Drawing Sheets

METHOD OF MAKING A DIELECTRIC FOR AN INTEGRATED CIRCUIT

TECHNICAL FIELD

This invention relates to methods of integrated circuit fabrication.

BACKGROUND OF THE INVENTION

As integrated circuit geometries shrink, those concerned with the design of such circuits are forced to use increasingly thinner gate dielectrics. For example, it is anticipated, that 0.25 micron (and below) MOSFET technologies will require a gate dielectric with a thickness of 4 nanometers or less. Such thin dielectrics exhibit comparatively high defect densities, lower breakdown and wearout behavior. Furthermore, such thin dielectrics do not present an adequate barrier to boron penetration from overlying boron doped polysilicon into the substrate. In addition, MOSFETs fabricated with such thin dielectrics frequently exhibit high leakage current at low voltage and lower interface resistance to current stress.

Those concerned with the development of integrated circuit technology have consistently sought better dielectrics and methods for their fabrication.

SUMMARY OF THE INVENTION

Illustratively, the present invention includes:

forming a dielectric upon a substrate by;

forming a first dielectric layer in the presence of nitrogen;

forming a second layer in the absence of all but trace amounts of nitrogen; and forming a third layer in the presence of nitrogen.

DETAILED DESCRIPTION

Figure 1:
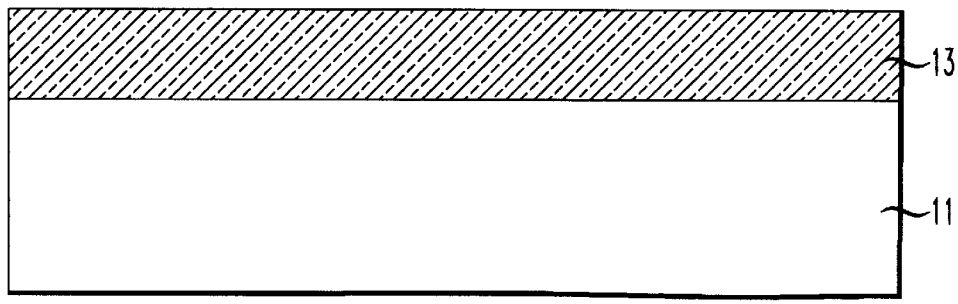
FIGS. 1, 2, and 3 are partial cross-sectional views of an integrated circuit showing an illustrative embodiment of the present invention.

In FIG. 1, reference numeral 11 denotes a substrate which may typically, silicon, doped silicon, epitaxial silicon, etc. After field oxide formation, (not shown) a thin layer of silicon dioxide 13 is grown in $N_2O$, NO or $NO_2$. The thickness is, illustratively, 0.5–2 nanometers. Illustratively, the process for forming layer 13 may include growth in oxygen or steam for a period of approximately 1–30 minutes at a temperature of 650° C.–1000° C., ideally at 850° C.

Figure 2:
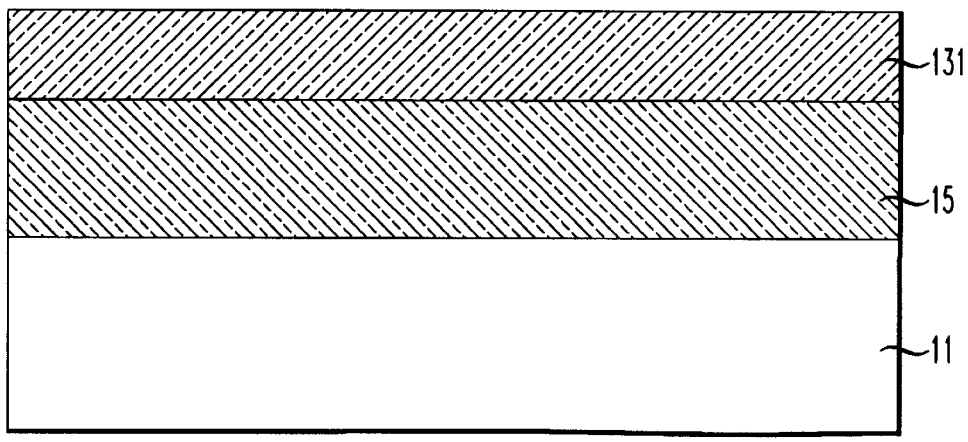

Turning to FIG. 2, the structure of FIG. 1 is then subjected to an oxygen or steam ambient to grow another 0.5–3 nanometers. There is no significant amount of nitrogen present in the reaction chamber for the second growth phase. The second growth phase produces a second layer of dielectric denoted by reference numeral 15. The growth process which forms dielectric 15 also pushes previously-formed nitrogen incorporated dielectric 13 upwards. Previously-formed dielectric 13 is denoted by reference numeral 131 in FIG. 2.

Figure 3:
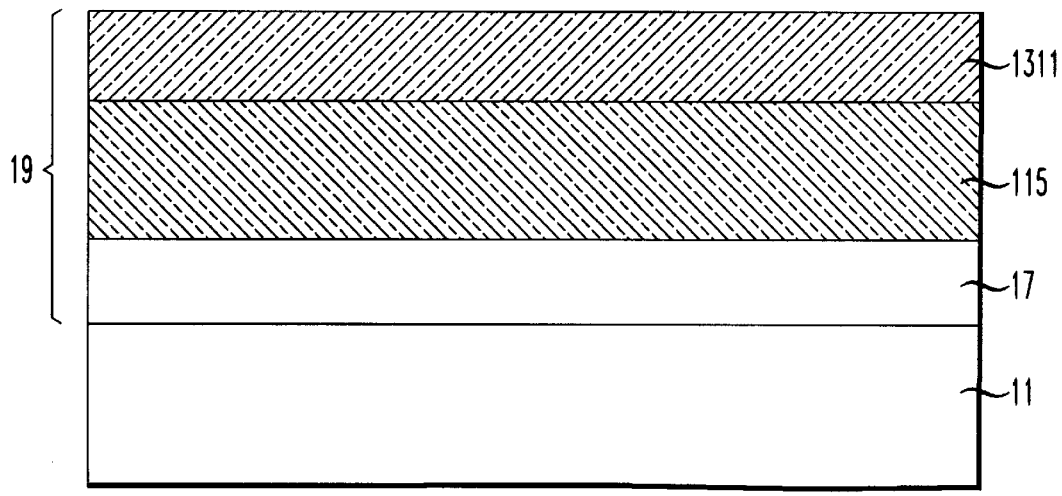

Turning to FIG. 3, an annealing step is performed in $N_2O$, NO or $NO_2$. The annealing step forms a dielectric 17 having a thickness between 0.5 and 2 nanometers. The process of forming dielectric 17 pushes the previously-formed layers upward. Previously-formed layer 15 is denoted in FIG. 3 as layer 115 and previously-formed layer 13 is denoted in FIG. 3 as layer 1311.

Layers 1311, 115, and 17, taken together form gate dielectric 19. Subsequent processing may, for example, include the deposition of a conductive material, such as polysilicon over dielectric 19, the subsequent patterning of the conductive material, such as polysilicon, formation of source and drain, and deposition in patterning of alternating layers of interlevel dielectric and conductive runners.

The total thickness of composite gate dielectric 19 and the relative thicknesses of dielectric sublayers may be adjusted by varying the oxidation time, temperature, and gas partial pressure for individual components, 1311, 115, and 17.

This process may be easily integrated into modern integrated circuit manufacturing processes very cheaply because it does not increase the number of manufacturing steps. The process is illustrated in FIG. 5.

Figure 5:
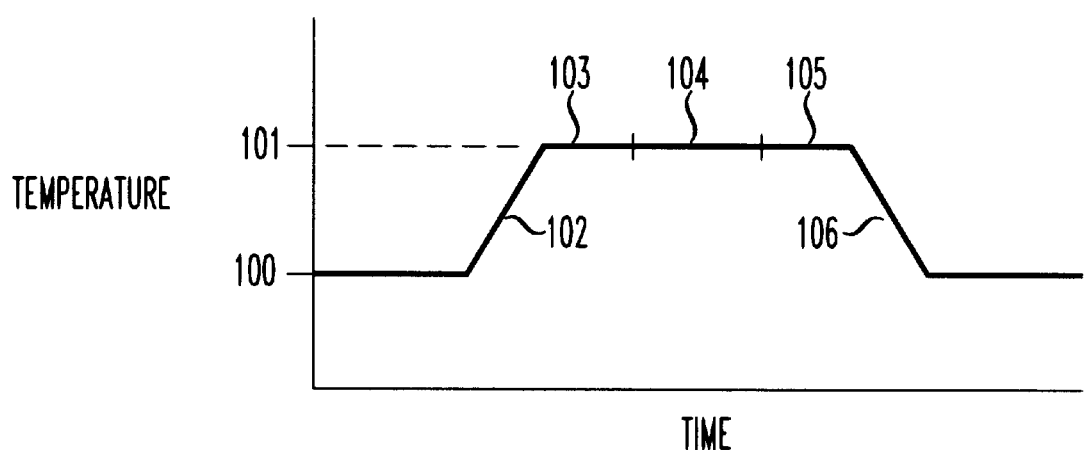
FIG. 5 is a graph depicting processing temperatures as a function of time according to an illustrative embodiment of the present invention.

In FIG. 5, reference numeral 100 represents the furnace ideal temperature which may be illustratively, approximately 700° C. Reference numeral 101 represents the oxidation processing temperature which may be illustratively 650° C.–1000° C., preferably 850° C. Reference numeral 102 represents a temperature ramp of approximately 5° C. per minute±1° C. per minute. Reference numeral 103 represents the oxidation process, utilizing nitrogen which forms layer 13. Reference numeral 104 represents the oxidation process without the presence of nitrogen which forms layer 15. Reference numeral 105 represents the oxidation process in the presence of nitrogen which forms layer 17. Reference numeral 106 represents furnace ramp down, illustratively at approximately 3° C.±1° C. per minute.

In layer 17, many silicon-hydrogen bonds which were typically found in dielectrics formed by other processes are absent as silicon-nitrogen bonds replaces them. Instead, layer 17 exhibits a relatively high density of silicon-nitrogen bonds which are typically stronger than silicon-hydrogen bonds and Si—O bonds, thereby producing a more reliable dielectric-crystalline silicon interface. The presence of nitrogen in layer 1311 provides a barrier against oxygen diffusion. This barrier tends to slow the oxidation rate of layer 17, thereby providing better uniformity for layers 115 and 17. Such uniformity is particularly important and increasingly difficult to achieve with thinner dielectrics and larger (8" and 12") diameter wafers. In addition, the presence of nitrogen in layer 1311 and layer 17 tends to block boron diffusion from overlying boron doped polysilicon layers. Furthermore, the presence of nitrogen in layer 113 makes layer 113 more resistant to the plasma etching process which is used to define the subsequently formed polysilicon layer. Such resistance is important because the thickness of the composite 19 is very low and is easily etched through. Presence of nitrogen in the bottom sublayer 17 near the silicon-dielectric interface improves breakdown, wearout and the resistance to current stress of the composite 3-layer dielectric (19).

Figure 4:
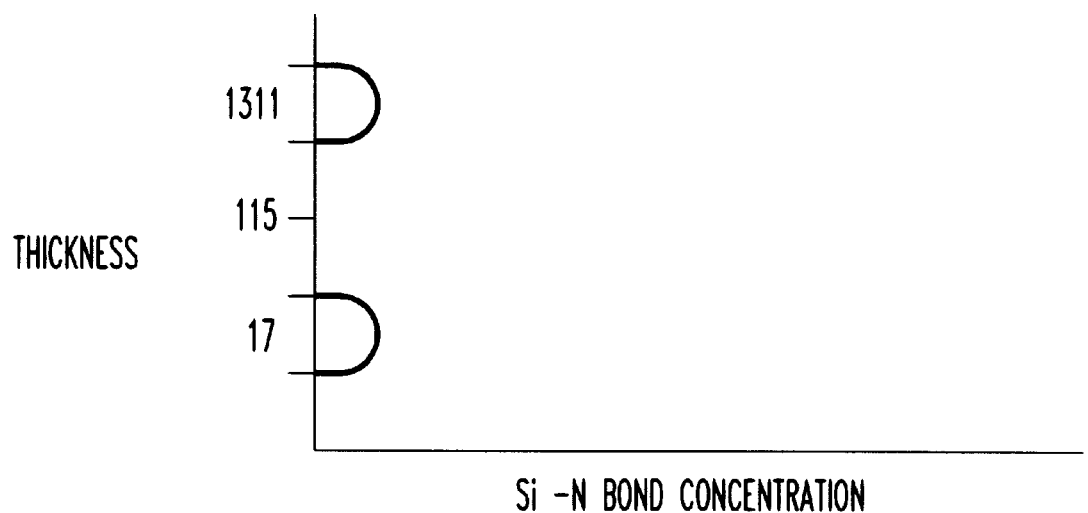
FIG. 4 is a graph depicting silicon-nitrogen bond concentration as a function of dielectric thickness in an illustrative embodiment of the present invention.

FIG. 4 is a graph depicting silicon-nitrogen bond concentration as a function of the individual layers depicted in FIG. 3. It will be noticed that silicon-nitrogen bond concentration is high in layers 1311 and 17, while very low in layer 115.

The invention claimed is:

1. A method of integrated circuit fabrication in a single chamber comprising;

forming a MOSFET by:

forming a MOSFET gate dielectric upon a silicon crystalline substrate by;

forming a first dielectric layer upon said substrate in the presence of nitrogen, wherein said first dielectric layer has a thickness of from about 5 Angstroms up to about 20 Angstroms;

forming a second dielectric layer upon said first dielectric layer in the absence of any significant amount of nitrogen, wherein said second dielectric layer has a thickness of from about 5 Angstroms up to about 30 Angstroms, and wherein said second layer consists essentially of silicon dioxide; and forming a third dielectric layer upon said second dielectric layer in the presence of nitrogen, wherein said third dielectric layer has a thickness of from about 5 Angstroms up to about 20 Angstroms;

said first, second and third dielectrics comprising said MOSFET gate dielectric;

forming a conductive layer upon said gate dielectric;

patterning said conductor to form a gate conductor;

forming a source and drain; and forming alternating layer of patterned dielectrics and metalization.

2. The method of claim 1 in which said first layer is formed by exposing said substrate to an atmosphere containing a gas chosen from the group consisting of $N_2O$, NO and $NO_2$.

3. The method of claim 1 in which said third layer is formed by exposing said substrate to an atmosphere containing a gas chosen from the group consisting of $N_2O$, NO and $NO_2$.

4. The method of claim 2 in which said first layer is formed by exposing said substrate at a temperature between 650° C. and 1000° C.

5. The method of claim 2 in which said third layer is formed by exposing said substrate at a temperature between 650° C. and 1000° C.

6. The method of claim 1 in which the thickness of said first layer is between 5 A° and 20 A°.

7. The method of claim 1 in which the thickness of said second layer is between 5 A° and 30 A°.

8. The method of claim 1 in which the thickness of said third layer is between 5 A° and 20 A°.

9. The method of claim 1 in which said gate conductor is polysilicon doped with boron.

10. A process of fabricating a dielectric in a furnace comprising the steps of forming the dielectric upon a substrate by;

exposing the substrate to a nitrogen based oxide at a furnace temperature to form a first dielectric layer having a thickness of from about 5 Angstroms up to about 20 A°;

subjecting the substrate to an oxygen based ambient to form a second dielectric layer having a thickness of from about 5 Angstroms up to about 30 A°; and exposing the substrate to a nitrogen based oxide at a annealing-furnace temperature to form a third dielectric layer having a thickness of from about 5 Angstroms up to about 20 A°.

11. The process of claim 10 wherein the furnace temperature is ramped up at about 5° C. per minute±1° C. per minute.

12. The process of claim 10 wherein the furnace temperature is ramped down at about 3° C. per minute±1° C. per minute.

* * * * *